United States Patent
Tarn (10) Patent No.: US 7,164,199 B2
(45) Date of Patent: Jan. 16, 2007

(54) DEVICE PACKAGES WITH LOW STRESS ASSEMBLY PROCESS

(75) Inventor: Terry Tarn, San Diego, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/238,885

(22) Filed: Sep. 28, 2005

(65) Prior Publication Data

US 2006/0027915 A1 Feb. 9, 2006

Related U.S. Application Data

(62) Division of application No. 10/698,656, filed on Oct. 30, 2003, now abandoned.

(51) Int. Cl.
*H01L 23/06* (2006.01)
*H01L 23/15* (2006.01)

(52) U.S. Cl. ............... 257/705; 257/684; 257/E23.008; 257/E23.009

(58) Field of Classification Search ................ 257/706, 257/684, 703, 705, 711, E23.008, E23.009
See application file for complete search history.

(56) References Cited

U.S. PATENT DOCUMENTS

| | | | |
|---|---|---|---|
| 4,178,077 A | 12/1979 | Te Velde | |
| 4,309,242 A | 1/1982 | Te Velde | |
| 5,010,233 A | 4/1991 | Henschen et al. | |
| 5,175,409 A | 12/1992 | Kent | |
| 5,293,511 A | 3/1994 | Poradish et al. | |
| 5,527,744 A | 6/1996 | Mignardi et al. | |
| 5,621,162 A | 4/1997 | Yun et al. | |
| 5,702,764 A | 12/1997 | Kimuara et al. | |
| 5,835,256 A | 11/1998 | Huibers | |
| 5,872,046 A | 2/1999 | Kaeriyama et al. | |
| 5,915,168 A | 6/1999 | Salatino et al. | |
| 5,952,572 A | 9/1999 | Yamashita et al. | |
| 5,963,289 A | 10/1999 | Stefanov et al. | |
| 5,998,242 A | 12/1999 | Kirkpatrick et al. | |
| 6,046,840 A | 4/2000 | Huibers | |

(Continued)

FOREIGN PATENT DOCUMENTS

EP 1097901 A2 5/2001

(Continued)

OTHER PUBLICATIONS

Tom Glenn, et al., Packaging Microscopic Machines, Machine Design, Dec. 7, 2000.

(Continued)

*Primary Examiner*—Nathan J. Flynn
*Assistant Examiner*—Victor A. Mandala, Jr.
(74) *Attorney, Agent, or Firm*—W. James Brady, III; Frederick J. Telecky, Jr.

(57) ABSTRACT

A microelectromechanical device package and a low-stress inducing method for packaging a microelectromechanical device are disclosed in this invention. The microelectromechanical device is accommodated within a cavity comprised by a first package substrate and a second substrate, wherein a third substrate is disposed between and bonded to both the microelectromechanical device lower semiconductor substrate and the package bottom substrate. The first and second package substrates are then bonded so as to package the microelectromechanical device inside.

11 Claims, 7 Drawing Sheets

U.S. PATENT DOCUMENTS

| | | | |
|---|---|---|---|
| 6,072,236 | A | 6/2000 | Akram et al. |
| 6,164,837 | A | 12/2000 | Haake et al. |
| 6,165,885 | A | 12/2000 | Gaynes et al. |
| 6,207,548 | B1 | 3/2001 | Akram et al. |
| 6,232,150 | B1 | 5/2001 | Lin et al. |
| 6,252,229 | B1 | 6/2001 | Hays et al. |
| 6,265,246 | B1 | 7/2001 | Ruby et al. |
| 6,287,940 | B1 | 9/2001 | Cole et al. |
| 6,297,072 | B1 | 10/2001 | Tilmans et al. |
| 6,303,986 | B1 | 10/2001 | Shook |
| 6,323,550 | B1 | 11/2001 | Martin et al. |
| 6,353,492 | B1 | 3/2002 | McClelland et al. |
| 6,458,627 | B1 | 10/2002 | Choi |
| 6,459,523 | B1 | 10/2002 | Ueda |
| 6,528,344 | B1 | 3/2003 | Kang |
| 6,541,832 | B1 | 4/2003 | Coyle |
| 6,614,003 | B1 | 9/2003 | Hembree et al. |
| 6,624,003 | B1 | 9/2003 | Rice |
| 6,649,446 | B1 | 11/2003 | Goetz et al. |
| 6,661,084 | B1 | 12/2003 | Peterson et al. |
| 6,704,131 | B1 | 3/2004 | Liu |
| 6,791,735 | B1 | 9/2004 | Stappaerts |
| 6,810,899 | B1 | 11/2004 | Franz et al. |
| 6,825,744 | B1 * | 11/2004 | Harney .................. 335/78 |
| 6,912,078 | B1 * | 6/2005 | Kudrle et al. ............ 359/224 |
| 6,946,742 | B1 * | 9/2005 | Karpman ................. 257/778 |
| 2001/0007372 | A1 | 7/2001 | Akram et al. |
| 2001/0022207 | A1 | 9/2001 | Hays et al. |
| 2001/0034076 | A1 | 10/2001 | Martin |
| 2001/0040675 | A1 | 11/2001 | True et al. |
| 2001/0048064 | A1 | 12/2001 | Kitani |
| 2002/0063322 | A1 | 5/2002 | Robbins et al. |
| 2002/0117728 | A1 | 8/2002 | Brosnihhan et al |
| 2002/0146200 | A1 | 10/2002 | Kudrie et al. |
| 2002/0180016 | A1 | 12/2002 | Shrauger et al. |
| 2003/0000737 | A1 | 1/2003 | Liu et al. |
| 2003/0008477 | A1 | 1/2003 | Kang et al. |
| 2003/0047533 | A1 | 3/2003 | Reid et al. |
| 2003/0089394 | A1 | 5/2003 | Chang-Chien et al. |
| 2003/0161027 | A1 | 8/2003 | Kurosawa et al. |
| 2003/0211654 | A1 | 11/2003 | Kocian et al. |
| 2004/0035840 | A1 | 2/2004 | Koopmans |
| 2004/0067604 | A1 | 4/2004 | Quellet et al. |
| 2004/0119143 | A1 | 6/2004 | Karpan |
| 2004/0190112 | A1 | 9/2004 | Huibers |
| 2004/0232535 | A1 | 11/2004 | Tam |

FOREIGN PATENT DOCUMENTS

| | | |
|---|---|---|
| EP | 1101730 A2 | 5/2001 |
| EP | 1167281 A2 | 1/2002 |
| JP | 2001129800 A | 5/2001 |
| JP | 2001144117 A | 5/2001 |
| JP | 2001196484 A | 7/2001 |
| WO | WO-01/10718 A1 | 2/2001 |
| WO | WO-01/20671 A1 | 3/2001 |
| WO | WO-02/12116 A2 | 2/2002 |
| WO | WO-02/12116 A3 | 2/2002 |

OTHER PUBLICATIONS

Balaji Sridharan, et al., Post-Packaging Release a New Concept for Surface Micromachined Devices, Mechanical and Aerospace Engineering Department, 4 pgs.

U. Gosele, et al., Wafer Bonding for Microsystems Technologies, Sensors and Actuators 74 (1999) pp. 161-168.

Masao Segawa, et al., A CMOS Inage Sensoer Module Applied for a Digital Still Camera Utilizing the Tab on Glass (TOG) Bonding Method, IEEE Transactions on Advanced Packaging, vol. 22., No. 2.

In-Byeong Kang, et al., The Application of Anisotropic Conductive films for Realisation of Interconnections in Micromechanical Structures, SPIE vol. 3321, pp. 233-238.

Sonja van der Groen, et al., CMOS Compatible Wafer Scale Adhesive Bonding for Circuit Transfer, International Conference on Solid- State Sensors and Actuators, Chicago, Jun. 16-19, 1997, pp. 629-632.

G. Blink, et al., Wafer Bonding With an Adhesive Coating, Part of the SPIE Conference on Micromachined Devices and Components IV, Santa Clara, California, Sep. 1998, pp. 50-61.

Christine Kallmayer, et al., A New Approach to Chip Size Package Using Meniscus Soldering and FPC-Bonding, IEEE Transactions on Components Packaging and Manufacturing Technology-Part C., vol. 21, No. 1., Jan. 1998, pp. 51-56.

Joachim Kloeser, et al., Low Cost Bumping by Stencil Printing: Process Qualification for 200 UM Pitch, 1998 International Synposium on Microelectronics, 11 pgs.

Michel M. Maharbiz, et al., Batch Micropackaging by Conpression-Bonded Wafer-Wafer Transfer, Microassembly Technologies, Inc, 8 Pgs.

Bharat Shivkumar, et al., Microrivets for MEMS Packaging:Concept, Fabriaction, and Strength Testing, Journal Of Microlectroomechanical Systems, vol. 6, No. 3, Sep. 1997, pp. 217-224.

Hideki Takagi, et al., Room Temperature Silicon Wafer Direct Bonding in Vacuum by Ar Beam Irradiation, Mechanical Engineering Laboratory, AIST. MITI., 6 Pgs.

Michael H. Beggans, et al., Optical Pressure Sensor Head Fabrication Using Ultra-Thin Silicon Wafer Anodic Bonding, Part of the Symposium on Design, Test, and Microfabrication of MEMS and MOEMS, 10 Pgs.

T.P Glenn, et al., Designing MEMS into Systems:Packaging Issues, http://www.ecnmag.com, 4 Pgs.

Kwon Sang Jik et al., Vacuum In-Line Sealing Technology with Auxiliary Heating Line for PDP Packaging, p. 320, Society for Information Display Digest 2002.

Espinosa et al., "Identification of Residual Stress State in an RF-MEMS Device", MTS Systems Corporation white paper (May 2000).

Franka et al., "Solder Bump Technology: Present and Future", Semiconductor Fabtech (May 1995).

Glenn et al., "Packaging Microscopic Machines", Machine Design (Dec. 7, 2000).

Harsh et al., "Flip-Chip Assembly for Si-Based MEMS", Proceedings of the 1999 IEEE International Conference on Microelectomechanical Systems (MEMS '99), Orlando, FL (Jan. 17-21, 1999). pp. 273-278.

Irwin et al., "Quick Prototyping of Flip Chip Assembly with MEMS", University of Colorado at Boulder white paper (Jul. 17, 2000).

Irwin et al., "Quick Prototyping of Flip-Chip Assembly with MEMS", portions of slide presentation from the NSF Center for Advanced Manufacturing and Packaging of Microwave, Optical and Digital Electronics at the University of Colorado at Boulder (1998).

Lee et al., "High-Q Tunable Capacitors and Multi-way Switches Using MEMS for Millimeter-Wave Applicatiions", portions of slide presentation from the NSF Center for Advanced Manufacturing and Packaging of Microwave, Optical and Digital Electronics at the University of Colorado at Boulder (Sep. 1998).

Lee et al., "Use of Foundry Services to Prototype MEMS for Millimeter-wave Applications", portions of slide presentation from the NSF Center for Advanced Manufacturing and Packaging of Microwave, Optical and Digital Electronics at the University of Colorado at Boulder (1998).

Luxbacher, T., "Spray Coating for MEMS, Interconnect & Advanced Packaging Applications", HDI Magazine (May 1999) (abstract only).

Moore, D., "Automation Requirements for Die Bonding Process", Electronics Engineer (Jul. 2000).

Tsau, C., "Wafer-Level Packaging", MIT Microsystems Technology Laboratories Annual Report (May 2000), p. 49.

Y.T. Cheng, et al., "Localized Silicon Fusion and Eutectic Bonding for MEMS Fabrication and Packaging", Journal of Microelectromechanical Systems, vol. 9, No. 1, Mar. 2000, pp. 3-8.

Liwei Lin, "MEMS Post-Packaging by Localized Heating and Bonding", 2000 IEEE, pp. 608-616.

Farhad Sarvar, et al., Application of Adhesives in MEMS and MOEMS Assembly: A Review, IEEE Polytronic 2002 Conference, pp. 22-28.

Seong-A Kim, et al., "Closed Loop Solder-Lines on Heated Substrates", 2002 Electronic Components and Technology Conference, pp. 1101-1105.

Giles Huimpston and David M. Jacobson, "Principles of Soldering and Brazing", ASM International, pp. 242-245- 7.3.2.3 Solution.

US 6,724,518, 04/2004, Meyer et al. (withdrawn).

* cited by examiner

DEVICE PACKAGES WITH LOW STRESS ASSEMBLY PROCESS

CROSS-REFERENCE TO RELATED CASES

This application is a divisional application of U.S. patent application Ser. No. 10/698,656 to Tarn, filed Oct. 30, 2003 now abandoned, the subject matter being incorporated herein by reference in entirety.

TECHNICAL FIELD OF THE INVENTION

The present invention is generally related to the art of packaging devices, and more particularly, to packaging stress sensitive devices.

BACKGROUND OF THE INVENTION

Stress sensitive devices, such as optical devices (e.g. photo detectors, CCDs, LCD, photodiodes), microelectromechanical systems (e.g. spatial light modulators using micromirrors) may suffer from device failure due to warping and stresses induced either during device packaging processes or in operation after improper packaging processes. In a typical packaging process, the device is attached to a package substrate for holding the device. When the coefficient of thermal expansion (CTE) of the package substrate does not match the device substrate that contacts the package substrate, the device will be warped, resulting in device failure.

An approach to solve this problem is to select device substrate and package substrate having the same or similar CTEs. However, this is not achievable in many situations because the selection of the device substrate and also the package substrate need to satisfy other requirements with higher priority.

Therefore, a method is desired for packaging stress sensitive devices with a low stress assembly process, while allows for employing a wide range of adhesives and packaging materials.

SUMMARY OF THE INVENTION

In view of the foregoing, the present invention discloses a method of packaging stress sensitive devices. Stresses, such as thermal stresses and warpage are reduced to tolerable levels by providing one or more substrates between the device and package substrates.

According to an embodiment of the invention, a substrate of a package for packaging a micromirror array device is provided therein. The substrate comprises: According to another embodiment of the invention, a method of packaging a micromirror array device is disclosed. The method comprises: providing a first package substrate; attaching a semiconductor device or a microelectromechanical device to an intermediate substrate layer; attaching said contraption to the first package substrate; placing a second substrate on the first package substrate; and bonding the first and second substrate using appropriate techniques.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 3b is a cross-sectional view of the package in FIG. 3a;

FIG. 4b is a cross-sectional view of the micromirror array package of FIG. 4a;

FIG. 5b is a cross-sectional view of the micromirror array device of FIG. 5a;

DETAILED DESCRIPTION OF THE INVENTION

Turning to the drawings, the present invention is illustrated as being implemented in a suitable packaging process for stress sensitive devices, such as optical devices (e.g. photo detectors, CCDs, LCD, photodiodes) and microelectromechanical systems (e.g. spatial light modulators using micromirrors). The following description is based on selected embodiments of the invention and should not be interpreted as a limitation of the invention with regard to alternative embodiments that are not explicitly described herein.

Figure 1A:
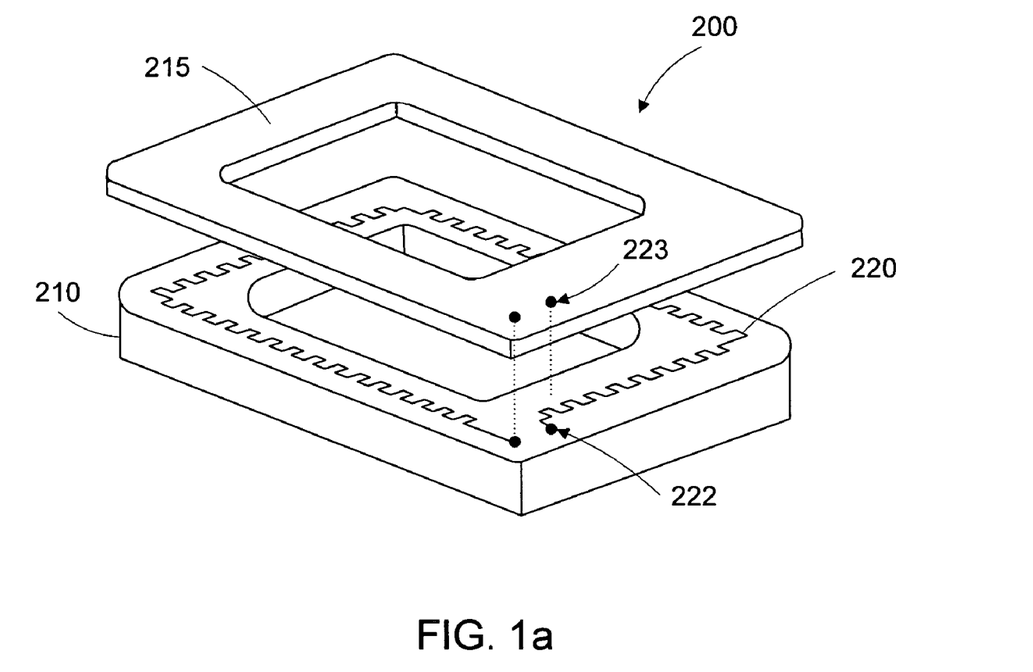
FIG. 1a is a diagram schematically illustrating a packaging substrate for packaging a micromirror array device, the packaging substrate having a heater that is formed along the periphery of one surface of the substrate and embedded underneath said surface of said substrate according to an embodiment of the invention.
Figure 1B:
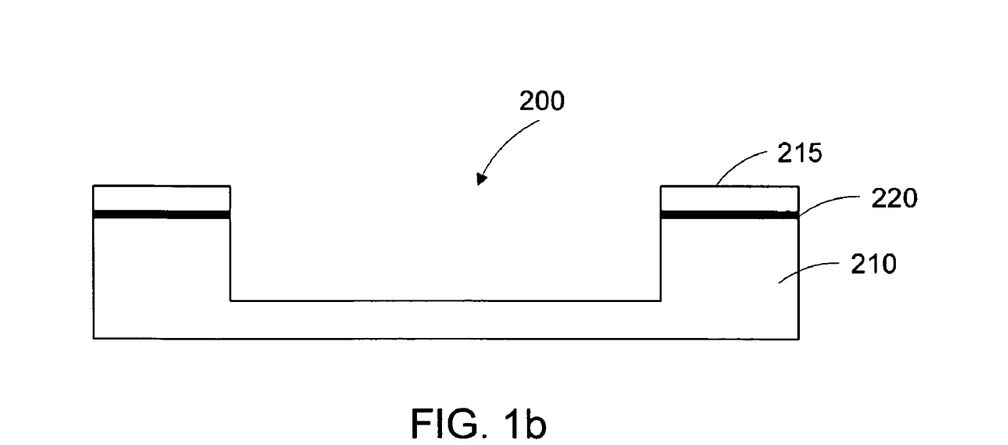
FIG. 1b is a cross-sectional view of the package substrate of FIG. 1.

Referring to FIG. 1a, a packaging substrate for packaging stress sensitive devices is illustrated therein. Packaging substrate 200 comprises substrate layer 210 and substrate layer 215. Substrate layer 210 has a concave surface that forms a cavity in which the stress sensitive device can be disposed. As an alternative feature, heater 220 is formed along the periphery of the concave surface of substrate layer 210. Electric current from external electric power source can be introduced into heater 220 via two leads 222 so as to generating heat. Heater 220 is laminated between substrate layers 210 and 215. A cross-sectional view of packaging substrate 200 is illustrated in FIG. 1b.

Substrate layers 210 and 215 can be any suitable preferably non-electrically conducting materials, preferably ceramic or glass, and more preferably ceramic. Other materials (e.g. organic or hybrid organic-inorganic materials) could also be used depending upon their melting points. In another embodiment of the invention, substrate layers 210 and 215 each can be a multilayered structure that further comprises a plurality of substrate layers. In this situation, the top layer, on which the heater is disposed, of substrate 210 and the bottom layer, which face the heater, of substrate 215 are preferably non-electrically conducting. Other layers, including the substrate layers underneath the top layer of substrate 210 and the substrate layers above the bottom layer of substrate 215 can be any desired materials, such as ceramic, glass and metallic materials.

Figure 2:
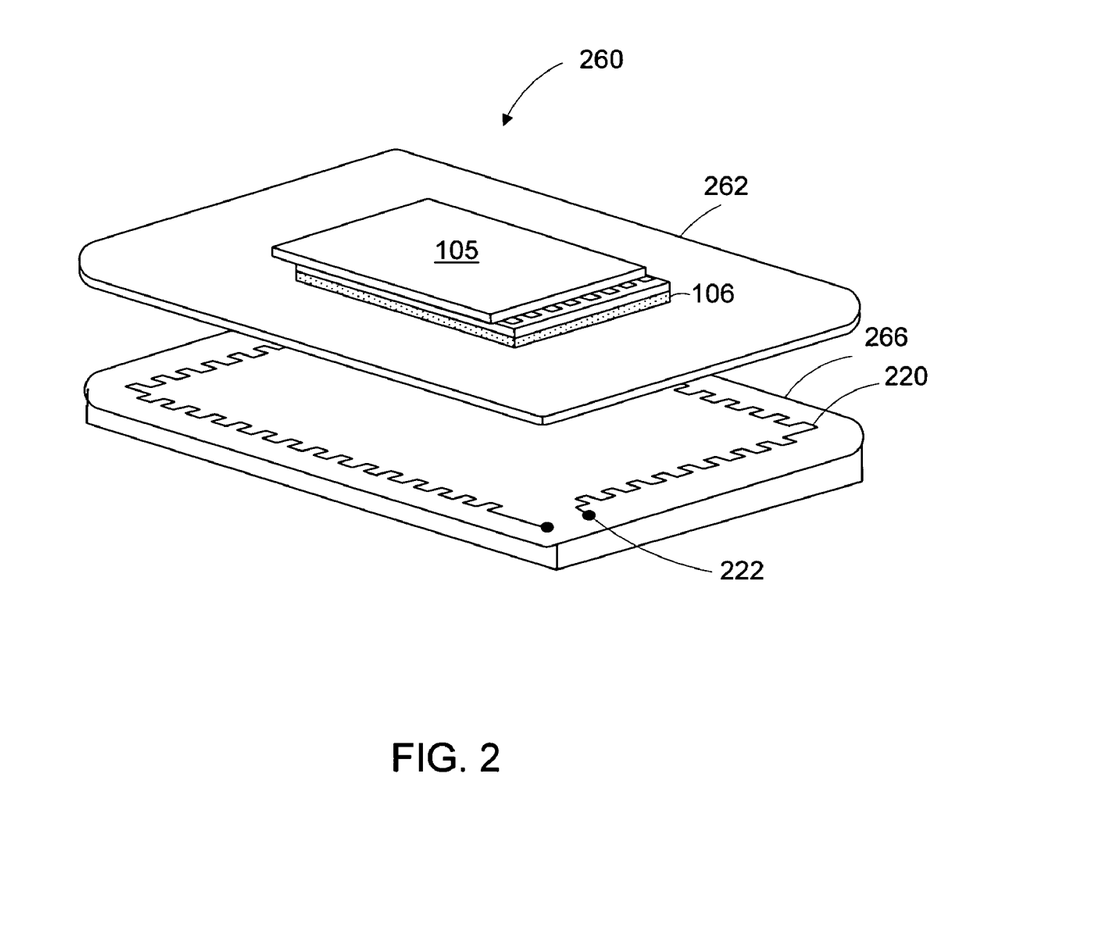
FIG. 2 is a diagram schematically illustrating a packaging substrate having a heater that is laminated between two layers of said packaging substrate according to another embodiment of the invention.

As discussed above, substrate layer 210 has a concave surface that forms a cavity in which micromirror array device can be placed. Alternatively, the substrate layers can be flat plates, as shown in FIG. 2. Referring to FIG. 2, substrate layers 266 and 262 of package substrate 260 both are flat plates. Alternatively, heater 220 is provided. The heater is formed on substrate layer 266 and along the periphery of the surface of substrate layer 266 and is laminated between substrate layers 266 and 262. Stress sensitive device, such as micromirror array device 105 can be bonded to substrate layer 106 and supported thereby by package substrate 262. Alternatively, the intermediate substrate layer 106 can be attached to package substrate 262 and further on provide support for micromirror array device 105. Substrate 106 consists preferably of a material with similar mechanical properties to that of the lower substrate material of the micromirror array device 105 (e.g. Si).

In the following, exemplary implementations of the embodiments of the present invention will be discussed with reference to packages of micromirror array devices and packaging processes for making the same. It will be understood by those skilled in the art that the following exemplary implementations are for demonstration purposes only and should not be interpreted by any ways as a limitation. In particular, although not limited thereto, the present invention is particularly useful for packaging semiconductor devices or micromirror array devices. The methods and packages disclosed can also be applied in packaging other type of stress sensitive devices, such as MEMS-based optical switches, image sensors or detectors and semiconductor devices. Other variations of the packaging substrates without departure from the spirit of the present invention may also be applicable. For example, the packaging substrate layers can be any desired shapes, other than the preferred rectangular shape.

Figure 3A:
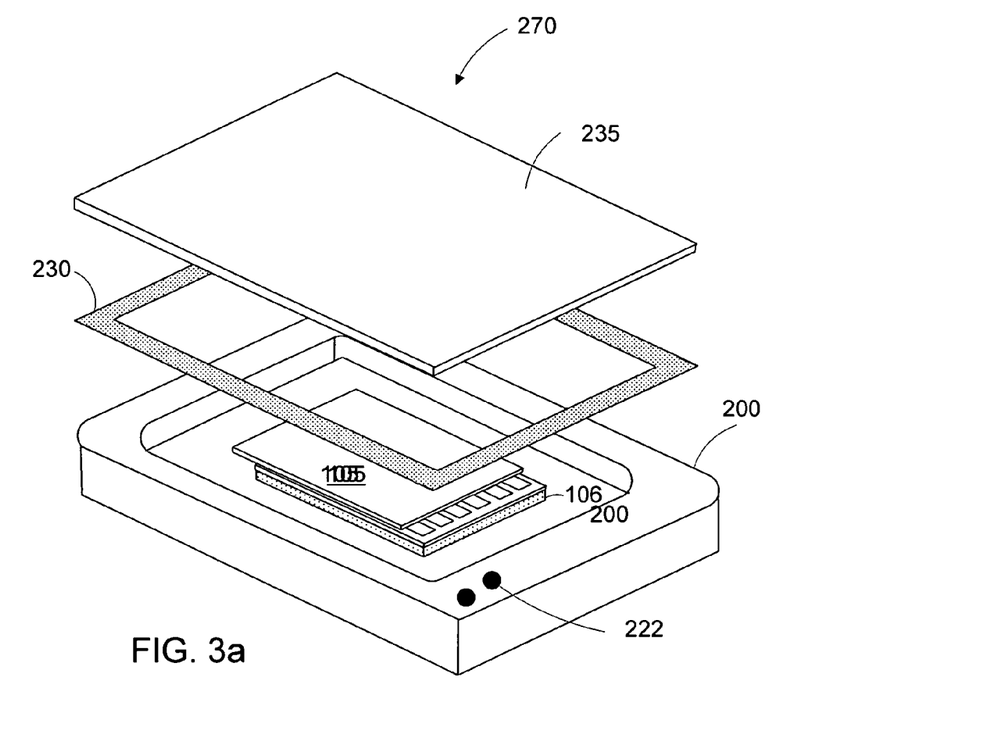
FIG. 3a is a diagram schematically illustrating a micromirror array device that is packaged using a packaging substrate in FIG. 1 according to another embodiment of the invention.

Referring to FIG. 3a, a micromirror array device package using the packaging substrate with an integral heater in FIG. 1 is illustrated therein. Specifically, micromirror array device 105 with attached substrate layer 106 is packed in the cavity of packaging substrate 200, which comprises integral heater 220 as shown in FIG. 1 and the intermediate layer 106 attached to said package substrate. A double substrate type micromirror device is illustrated, however, as in all the drawings, a single substrate device (e.g. micromirrors formed on silicon wafer) could be used. Cover substrate 235, which is preferably glass, is provided for sealing the micromirror array device within the cavity. In order to bond cover substrate 270 and packaging substrate 200, sealing medium 230, preferably one that forms a hermetic seal and has a melting temperature of 300° C. or less, and preferably 200° C. or less, is disposed between the cover substrate and packaging substrate as shown. Preferably the sealing material is an inorganic material such as a metal, metal alloy or metal compounds (e.g. a metal or metalloid oxide). Alternatively, sealing medium layer 230 can also be deposited directly on the surface of packaging substrate 200, or on the surface of the lower surface of cover substrate 235, in which case, sealing medium layer 230 is preferably deposited along the periphery of the lower surface of the cover substrate. Sealing medium 230 is preferably a material that is stable, reliable, cost-effective and has good thermal-properties (e.g. co-efficient of thermal expansion (CTE), thermal-conductivity etc.) compatible with the other components, such as package substrate 200 and cover substrate 235, of the micromirror array device package. It is further preferred that sealing medium has a low melting temperature (when the sealing medium is non-metallic) or soldering temperature (when the sealing medium is metallic). Glass frit, such as Kyocera KC-700, is an acceptable candidate for the sealing medium. During the bonding process, an electric current is driven through the integral heater via the two heater leads (i.e. leads 222) for generating heat. The amplitude of the electric voltage is dominated by electric characteristics of the heater (e.g. electric properties of the material of the heater, the shape of the heater), thermal characteristics and geometry of the substrate layers of packaging substrate 200 and the desired temperature on the surface of packaging substrate 200 for melting sealing medium (e.g. sealing medium layer 230). As an example, the melting temperature, also the desired temperature on the surface of packaging substrate 200, of sealing medium 230 is from 100 to 300° C., preferably around 350° C. The heater is embedded underneath the surface of the packaging substrate at a distance preferably from 1 millimeter to 10 millimeters, preferably around 7 millimeters. In this example, the packaging substrate is ceramic. Then the voltage set up between the two heater leads 222 is preferably from 40 to 100 volts, preferably around 70 volts. In other words, this voltage causes the heater generating heat with an amount that raises the surface temperature of the packaging substrate to the melting temperature of sealing medium layer 230. As a result, sealing medium is melted and used to bond cover substrate 235 and packaging substrate 200. Meanwhile, the temperature at the micromirror device location is far less than the temperature that causes mechanical failure of the micromirrors of the micromirror device. In the embodiment of the invention, the temperature at the micromirror device location is preferably less than 70° C.

Figure 3B:
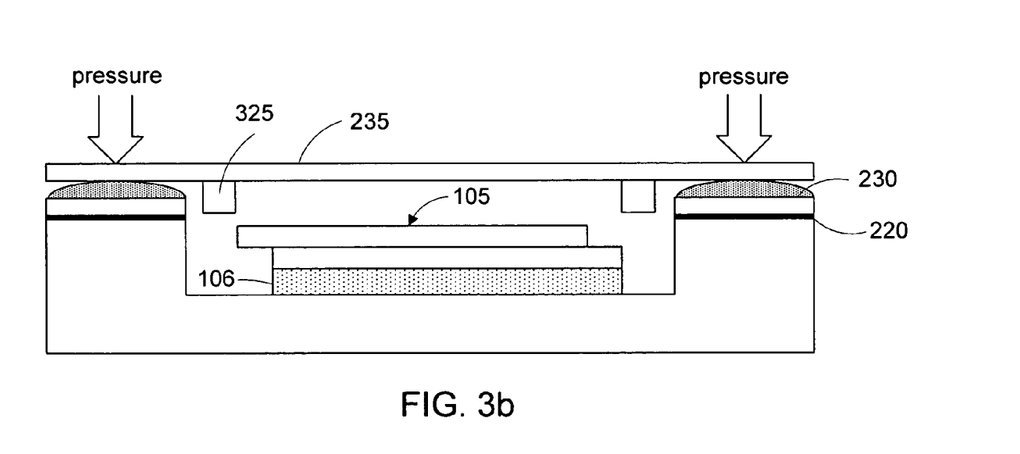

During the bonding process, external pressure may be applied to the cover substrate, as shown in FIG. 3b, wherein a cross-sectional view of FIG. 3a is illustrated therein. After a predetermined time period when the cover substrate and the packaging substrate are securely bonded, the voltage, as well as the external pressure, can be withdrawn, but not necessarily at the same time. As shown in FIG. 3b, one or more getters 325 can be provided within the package 270 for absorbing moistures and impurity particles (e.g. organic particles) either sealed within the cavity or emitted from the components of package 270 during the packaging process, especially during the heating process.

Though cover substrate 235 is preferably visible light transparent glass, it may also consist of other materials, such as metals or materials that are not transparent to visible light. In these cases, cover substrate 235 preferably comprises an inlay light transparent glass for allowing light to travel through and shine on micromirror array device 105. Alternatively, cover substrate 235 may have an opening forming window with a light transparent glass mounted on the window for allowing transmission of incident light. Moreover, a light blocking mask with light blocking strips formed around the circumference of the mask may be applied along cover substrate 235 for blocking incident light not shining on the surface of the micromirror array device. By this, optical performance, such as contrast ratio, of the micromirror array device can be improved.

Other than using glass frit as sealing medium, other suitable materials, such as solderable metallic materials, such as Au, $BiSn_x$, $AuSn_x$, $InAg_x$, $PbSn_x$, and copper, may also be used. However, most solderable metallic materials have poor adhesion to oxide materials or layers that often form on surfaces of the substrates. To solve this problem, a metallization film is preferably employed to metalizing the surface of the substrate before using solderable metallic sealing mediums, which will be discussed in further detail in the following.

Figure 4A:
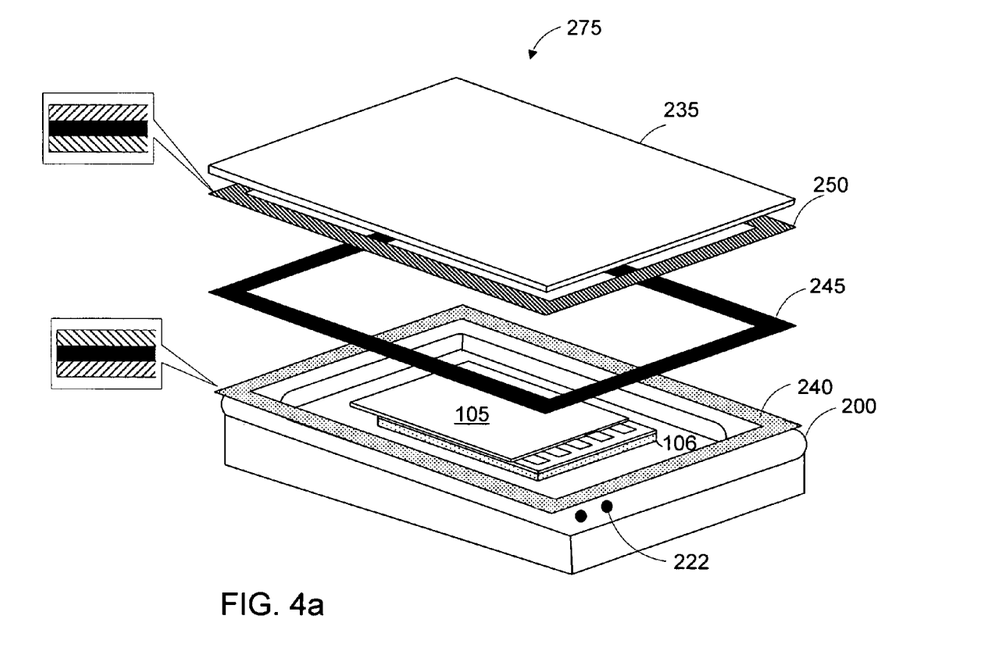
FIG. 4a is a diagram schematically illustrating a micromirror array device that is packaged using a packaging substrate in FIG. 1 according to yet another embodiment of the invention.

Referring to FIG. 4a, sealing medium layer 245 comprises a solderable metallic material that is preferably stable, reliable, cost-effective and has thermal-properties (e.g. co-efficient of thermal expansion (CTE), thermal-conductivity etc.) compatible with the other components, such as package substrate 200 and cover substrate 235, of the micromirror array device package, and more preferably has a low soldering temperature. In order to enhancing adhesion of sealing medium layer 245. to the surfaces of substrates 235 and 200, metallization layers 240 and 250 are provided for metalizing the lower surface of cover substrate 235 and top surface of package substrate 200, respectively. Metallization mediums can be any suitable materials, such as aluminum, gold, nickel or composition of two or more of suitable metallic elements, such as gold/nickel, preferably a material with low soldering temperature. These materials can be deposited on the surfaces as thick or thin films using suitable deposition methods, such as those standard methods (e.g. sputtering) for depositing thin film and those standard methods (e.g. print and paste) for depositing thick films. In an embodiment of the invention, metallization medium layer 250 is a thin layer of noble metallic material, such as gold. This metallization medium layer is preferably deposited, such as sputtered as a film on the lower surface of cover substrate 235. Similarly, another metallization layer 240 is provided between sealing medium layer 245 and package substrate 200 for metalizing the top surface of the package substrate. Metallization layer 240 is also preferably deposited, such as sputtered as a film on the upper surface of package substrate 200. When metallization layers 250 and 240 are respectively deposited on the lower surface of cover substrate 235 and the upper surface of substrate 200, these metallization layers may have high soldering temperatures. In this situation, theses metallization layers are integral with cover substrate 235 and substrate 200, respectively. Alternatively, metallization layers 250 and 240, each could be a multilayered structure. As an example, the multilayered structure comprises a metal-oxide layer (e.g. $CrO_2$ and $TiO_2$), a metallic layer (e.g. Cr and Ti), a second metallic layer (e.g. Ni) and a third metallic layer (e.g. Au) on top. The metal-oxide layer is first deposited on the surface of the non-metallic substrate, such as ceramic and glass, because it presents strong adhesion to the non-metallic substrate's surface, which is generally oxidized. The metallic layer generally comprises a metallic material that has strong adhesion to the metallic-oxidation layer. The second metallic layer is deposited between the third metallic layer and the first metallic layer to prevent diffusion of the first metallic material into the third metallic layer on top. As another example, metallization layer 240 further comprises a tungsten layer, a nickel layer and a gold layer. Of course, metallization medium layer 250 may also be a multilayered structure that further comprises a plurality of metallization layers as desired. The third metallic layer on top, preferably comprises a metallic material having low oxidation. Exemplary metallic materials for the third metallic layer are, Au, Cr and other noble metals.

During the packaging process, the integral heater embedded underneath the surface of package substrate 200 is electrically powered for generating heat so as to solder sealing medium layer 245 between metallization layers 240 and 250. Meanwhile, external pressure may be applied to the package for enforcing bonding package substrate 200 and cover substrate 235, as shown in FIG. 4b.

In another embodiment of the invention, cover substrate 235 may also have a heater. As the heater (e.g. heater 220) in package substrate 200 as described with reference of FIG. 1a, the heater in cover substrate 235 can be formed along the periphery of the surface of the cover substrate and embedded underneath said surface of the cover substrate. This heater in the cover substrate can be used in bonding the cover substrate and the package substrate. And it is especially useful in soldering metallization medium layer 250 and sealing medium layer 245.

Figure 4B:
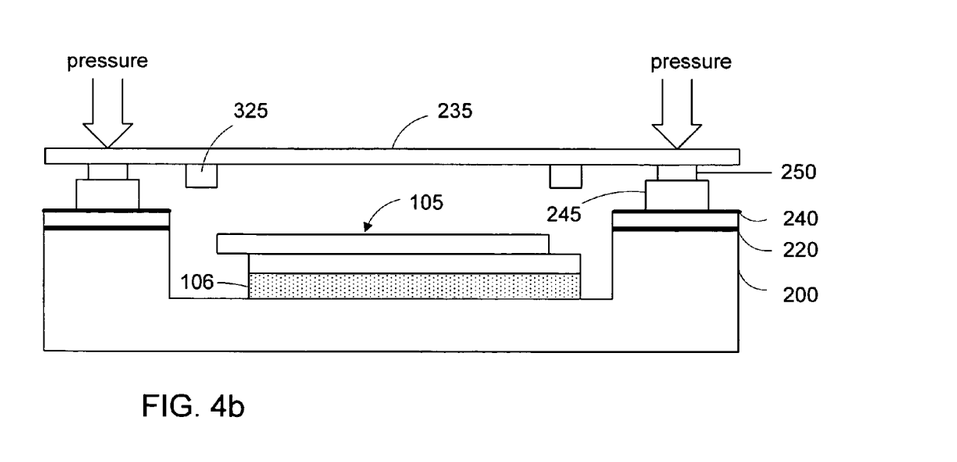

A cross-sectional view of package 275 in FIG. 4a is illustrated in FIG. 4b. As seen, other features, such as getters 325 can be provided for absorbing moisture.

Figure 5A:
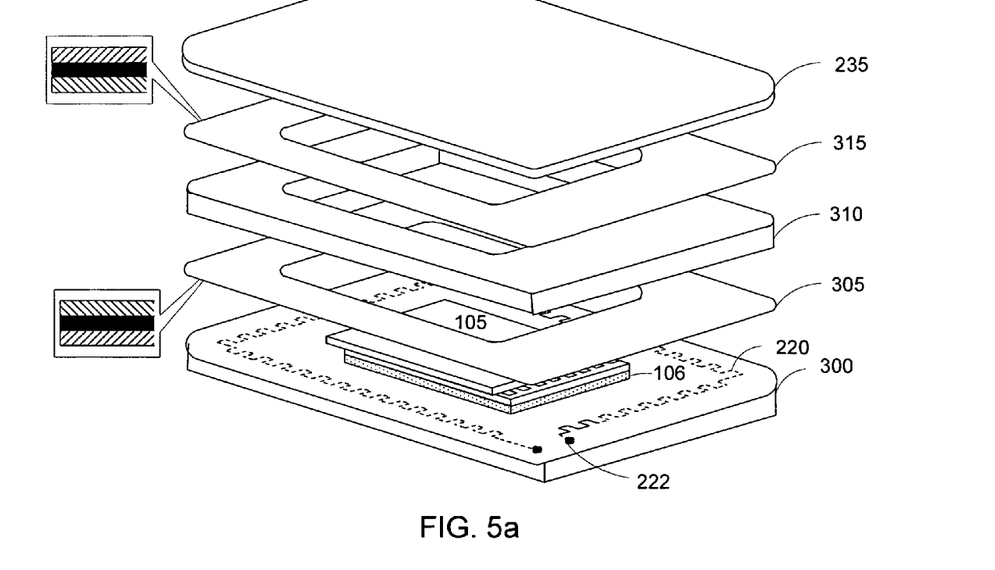
FIG. 5a is a diagram schematically illustrating a micromirror array device that is packaged using a packaging substrate of FIG. 2 according to yet another embodiment of the invention.

Referring to FIG. 5a, a micromirror array device package using the package substrate as shown in FIG. 2 according to further embodiment of the invention is illustrated therein. As seen, package substrate 300 is a flat plate with integral heater 220 embedded underneath the surface of the package substrate. Micromirror array device 105 is bonded to substrate layer 106 and supported thereby by package substrate. Spacer 310 is placed on the package substrate and forms a space along with package substrate 300 and layer 106 for accommodating the micromirror array device. Cover substrate 320 is placed above the spacer and the package substrate. In order to bonding the package substrate, the spacer and the cover substrate into a micromirror array device package, sealing medium layers 315 and 305 are provided between the cover substrate and the spacer, and between the spacer and the package substrate, respectively. In the embodiment of the invention, package substrate 300 and spacer 310 are ceramic. Alternatively, spacer 310 can be, Kovar, Invar, and $NiFe_x$. And cover substrate 320 is light transparent glass. Sealing medium layers 315 and 305 are glass frit. During the packaging process, heater 220 is electrically powered for generating heat so as to melt sealing medium layers 305 and 315. Alternatively, external pressure (not shown) can be applied to enforcing the bonding.

As discussed above, cover substrate 320 is glass for allowing incident light traveling through to shine on the micromirror array device. Alternatively, the cover substrate can be a ceramic or metallic material or any other desired materials that are not transparent to visible light. In this case, the cover substrate comprises a window with inlay glass for allowing incident light passing through. Alternatively, a glass plate may be mounted on the window of the substrate that is not incident light transparent. As a further alternative feature of the embodiment, a light blocking mask (e.g. a rectangular frame) that blocks incident light around the periphery of the micromirror array device is attached to the surface of the cover substrate, or directly painted or otherwise deposited around the circumference of the cover substrate. This is particularly useful when the cover substrate is glass.

Other than the flat shape, the cover substrate can be a concave cover cap (not shown) with the lower surface of the cover substrate extended towards the opposite surface (e.g. the top surface) of the cover substrate. In this case, the cover cap and package substrate 300 can form a space for housing the micromirror array device without spacer 310. Accordingly, the number of metallization medium layers and the number of sealing medium layers can be reduced, and bonding process can be simplified. For example, when cover substrate 320 that is a cover cap and package substrate 300 is provided for housing micromirror array device 105, packaging processes described with reference to FIGS. 3*a* and 4*a* can be directly applied herein.

Figure 5B:
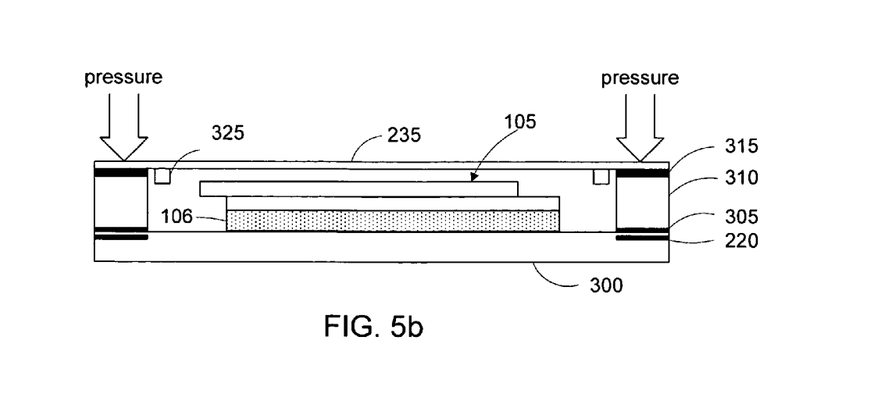

Referring to FIG. 5*b*, a cross-sectional view of the micromirror array package in FIG. 5*a* is illustrated therein. In addition to the packaging substrate, the intermediate layer attached to it, the cover substrate, the sealing medium layer and the metallization medium layers, getters may also be formed within the package. The cover light transmissive substrate need not be parallel to the lower substrate, and the micromirror array device, such as set forth in U.S. patent application Ser. No. 10/343,307, filed on Jan. 29, 2003 to Huibers, the subject matter of which being incorporated herein by reference.

Figure 6A:
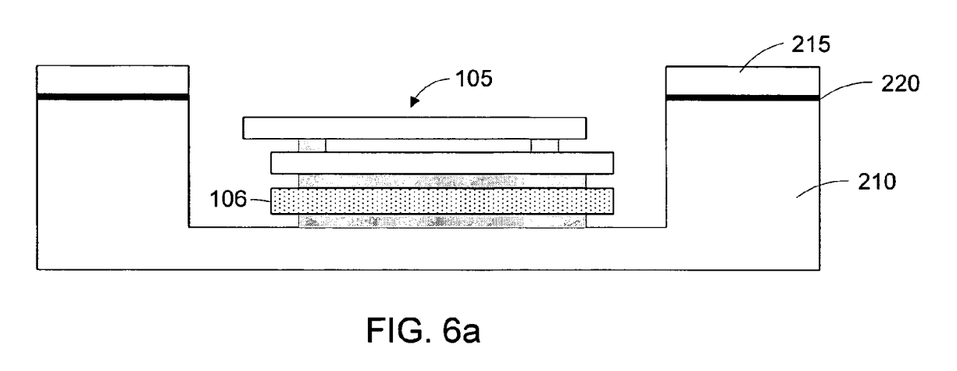
FIG. 6a is a cross-sectional view of the micromirror array device of FIG. 3, schematically illustrating the adhesive layers used for bonding the micromirror array device to an intermediate substrate and to the package according to one embodiment of the invention.
Figure 6B:
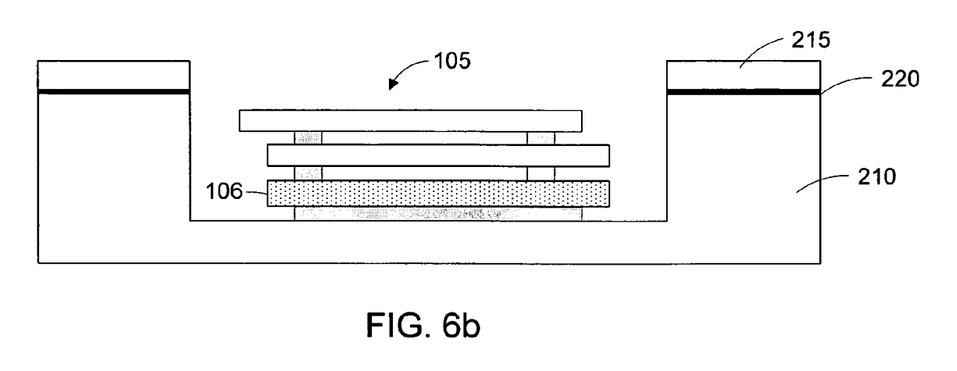
FIG. 6b illustrates a cross-sectional view of the micromirror array device of FIG. 3, depicting the different adhesive layers used for bonding the micromirror array device to an intermediate substrate and to the package according to another embodiment of the invention.

Referring to FIG. 6*a*, a cross-sectional view of a micromirror array device package using the packaging substrate with an integral heater of FIG. 1 is illustrated therein. Specifically, a double substrate type micromirror device 105 is shown with two separate adhesive layers bonding said substrates. An even adhesive layer further bond said device with substrate layer 106 and the same method is employed in bonding layer 106 with package substrate 210. The addition of substrate layer 106 to the bonding process of the micromirror device to the packaging substrate allows for a wide range of adhesives and packaging materials to be adapted into the assembly process, since most of the stress induced during assembly and packaging is now supported by insert 106 instead of micromirror device 105. However, substrate layer 106 can suffer from flexure and/or creep, which can be transferred to micromirror device 105, due to this induced stress and the CTE mismatch of the materials. In order to prevent this, FIG. 6*b* shows a different pattern in adhesive dispensing for bonding the double substrate micromirror device 105 to layer 106 according to another embodiment of the invention.

Figure 6C:
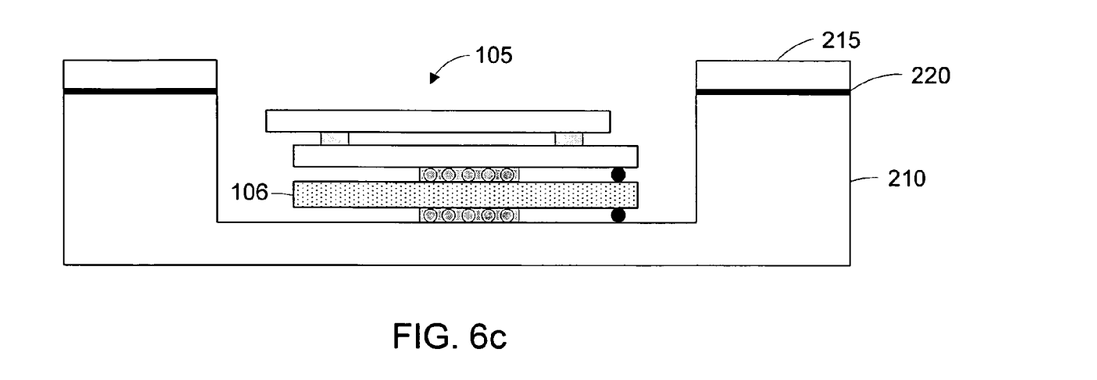
FIG. 6c is a cross-sectional view of the micromirror array device of FIG. 3, schematically illustrating the different exemplary adhesive layers and substances used for bonding the micromirror array device to an intermediate substrate and to the package according to yet another embodiment of the invention.
Figure 6D:
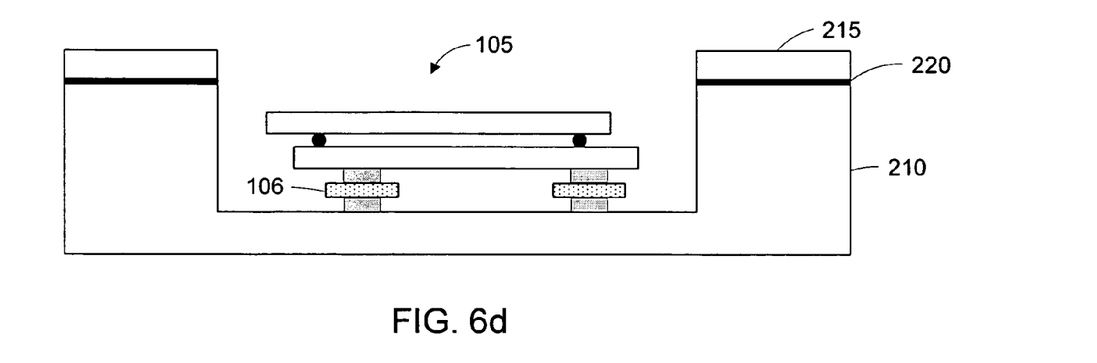
FIG. 6d illustrates a cross-sectional view of the micromirror array device of FIG. 3, depicting the different exemplary adhesive layers and substances used for bonding the micromirror array device to an intermediate discontinuous substrate and to the package according to one embodiment of the invention.

Substrate layer 106 is in this case attached to micromirror device 105 using small quantities of adhesive substance, which successfully minimizes flexure problems but may create instead a heat transfer problem between the two substrates due to the reduction of contact surface. As a further alternative, FIG. 6*c* illustrates another dispensing pattern for the adhesive layer that bonds substrate layer 106 to the double substrate micromirror device 105. Another alternative to this problem is shown in FIG. 6*d*, which illustrates a cross-sectional view of a micromirror array device package using the packaging substrate with an integral heater of FIG. 1 according to yet another embodiment of the invention. In this embodiment the two substrates of micromirror device 105 are bonded together using a doped adhesive substance, while substrate insert 106 is now a discontinuous layer bonded with adhesive substance to both micromirror device 105 and package substrate 210. Alternatively, multiple discontinuous substrate inserts can exist between the assembly and the package, which greatly reduces flexure resulted from the CTE mismatch and/or deformation of the bonding materials or the insert itself.

It will be appreciated by those skilled in the art that a new and useful micromirror array package and methods of applying the same for packaging micromirror array devices have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, other protective materials, such as inert gas, may be filled in the space formed by the package substrate and the cover substrate. For another example, the package substrate, as well as the cover substrate and the spacer, can be other suitable materials, such as silicon dioxide, silicon carbide, silicon nitride, and glass ceramic. For yet another example, other suitable auxiliary methods and components, such as applications of Infrared Radiation during bonding for soldering the sealing medium layers, and pillars or other structures for aligning the substrates are also applicable. Moreover, other desired materials, such as anti-stiction material, preferably in vapor phase for reducing stiction of the micromirrors of the micromirror array device, may also be deposited inside the package. The anti-stiction material can be deposited before bonding the cover substrate and lower substrate. When the cover substrate (e.g. cover substrate 235 in FIGS. 3*a* and 3*b*) is glass that is visible light transmissive, it can be placed parallel to the micromirror array device (e.g. device 105 in FIGS. 3*a* and 3*b*) and the package substrate. Alternatively, the cover substrate may be placed at an angle with the micromirror array device or the package substrate. Therefore, the invention as described herein contemplates all such embodiments as may come within the scope of the following claims and equivalents thereof.

I claim:

1. A packaged microelectromechanical device, comprising:
   a microelectromechanical array device that comprises a semiconductor substrate;
   a package for the microelectromechanical array device, the package comprising a ceramic package substrate;
   a discontinuous insert substrate that is disposed between the semiconductor substrate and the ceramic package substrate; and
   wherein the discontinuous insert substrate has a CTE value that is the same as a CTE value of the semiconductor substrate or between the value of the semiconductor substrate and a CTE value of the package substrate.

2. The device of claim 1, wherein the semiconductor substrate is silicon.

3. The device of claim 2, wherein the microelectromechanical array comprises a light transmissive substrate bonded to the semiconductor substrate.

4. The device of claim 3, wherein the light transmissive substrate is glass or quartz.

5. The device of claim 3, wherein the microelectromechanical array comprises a plurality of micromirrors formed on the light transmissive substrate.

6. The device of claim 5, wherein at least 500,000 micromirrors are disposed on the light transmissive substrate.

7. The device of claim 1, wherein the microelectromechanical array are formed directly on the semiconductor substrate.

8. A packaged microelectromechanical device, comprising:
- a microelectromechanical array device that comprises a semiconductor substrate;
- a package substrate having a cavity in which the microelectromechanical array device is disposed; and
- a discontinuous insert substrate that is disposed between the semiconductor substrate and the package substrate in a direction perpendicular to the package substrate.

9. The device of claim 8, wherein the package substrate is ceramic.

10. A packaged microelectromechanical device, comprising:
- a microelectromechanical array device that comprises a semiconductor substrate;
- a ceramic package substrate having a supporting surface; and
- discontinuous insert substrate that is disposed between the semiconductor substrate and the supporting surface of the ceramic package substrate in a direction perpendicular to the package substrate.

11. The device of claim 10, wherein the supporting surface is within a cavity of the ceramic package substrate.

* * * * *